United States Patent [19]

Bayerer et al.

[11] Patent Number: 5,777,849
[45] Date of Patent: Jul. 7, 1998

[54] POWER SEMICONDUCTOR MODULE HAVING ELONGATE PLUG CONTACTS

[75] Inventors: Reinhold Bayerer, Reichelsheim; Gerald Hilpert, Lauchringen, both of Germany; Rolf Schifferli, Mandach, Switzerland

[73] Assignee: Asea Brown Boveri AG, Baden, Switzerland

[21] Appl. No.: 597,133

[22] Filed: Feb. 6, 1996

[51] Int. Cl.⁶ .................... H01L 23/48; H01L 23/12
[52] U.S. Cl. .................... 361/730; 361/775; 361/812; 361/813; 361/822; 257/693; 257/700; 439/76.1
[58] Field of Search .................... 361/730, 732, 361/733, 735, 775, 809, 812, 813, 822, 823; 257/684, 686, 688, 689, 691, 693, 700, 709; 439/76.1, 79, 80; 174/70 B, 71 B, 72 B, 88 B

[56] References Cited

U.S. PATENT DOCUMENTS

| | | | |
|---|---|---|---|
| 4,538,168 | 8/1985 | Van Dyk Soerewyn | 257/693 |
| 4,766,481 | 8/1988 | Gobrecht et al. | 257/700 |
| 4,819,042 | 4/1989 | Kaufman | 257/693 |
| 4,899,256 | 2/1990 | Sway-Tin | 361/730 |
| 5,446,317 | 8/1995 | Sato et al. | 257/734 |
| 5,457,879 | 10/1995 | Gurtler et al. | 29/845 |
| 5,635,757 | 6/1997 | Stockmaier et al. | 257/691 |
| 5,679,008 | 10/1997 | Takahashi et al. | 439/76.1 |

FOREIGN PATENT DOCUMENTS

| | | |
|---|---|---|
| 0 618 613 | 10/1994 | European Pat. Off. . |
| 85 13 761.8 | 2/1989 | Germany . |
| 88 16 510.8 | 11/1989 | Germany . |
| 39 37 045 | 5/1991 | Germany . |
| 41 06 184 | 9/1992 | Germany . |
| 41 30 160 | 3/1993 | Germany . |

*Primary Examiner*—Leo P. Picard
*Assistant Examiner*—John B. Vigushin
*Attorney, Agent, or Firm*—Oblon, Spivak, McClelland, Maier & Neustadt, P.C.

[57] ABSTRACT

A power semiconductor module is specified. It comprises a housing into which any desired power semiconductor circuit is installed. The power semiconductor circuit has at least two connections, which are passed out of the housing. According to the invention, the connections have the form of an elongate plug contact. An insulating plate may additionally be provided between the adjacent plug contacts. Reliable, yet easily releasable, low-inductance electrical contact is achieved by this form of the connections.

7 Claims, 3 Drawing Sheets

POWER SEMICONDUCTOR MODULE HAVING ELONGATE PLUG CONTACTS

FIELD OF THE INVENTION

The invention is concerned with the field of power electronics. It is based on a power semiconductor module according to the preamble of the first claim.

BACKGROUND OF THE INVENTION

A power semiconductor module of this type is described, for example, in European Patent Application EP 0 597 144 A1. Power semiconductor modules according to the prior art have a housing in which a power semiconductor circuit is arranged. The function and the structure of the power semiconductor circuit are as desired and are not critical for the invention. The connections of the power semiconductor circuit are passed out of the housing. They are made contact with there by busbars or by cables, for example. For this purpose, as in the document mentioned at the beginning, for example, the connections are furnished with holes for bushing a screw contact. Modules configured in this way have the disadvantage that the screw contact cannot be released without a tool. Although a connection with plugs and sockets would also be conceivable, this has a contact area which is too small for the high currents required. The use of connecting cables having plug or screw contacts is also disadvantageous with regard to inductances caused by cable loops.

SUMMARY OF THE INVENTION

The object of the present invention is to specify a power semiconductor module in which the electrical contact with the busbars can be established in an extremely simple manner and which nevertheless has a sufficient contact area between the module connections and the busbars. In addition, the contact-making arrangement is to be constructed such that it has minimum inductance.

In the case of a power semiconductor module of the type mentioned at the beginning, this object is achieved by means of the features of the first claim.

The core of the invention, therefore, is that the connections of the module have the form of an elongate plug contact. An insulating plate is preferably provided between two adjacently arranged plug contacts. The plug contacts can be fitted to one long side of the module housing and extend, for example, at least over half of the long side of the module housing.

An embodiment in which the plug contacts comprise a multiplicity of parallel contact points is particularly preferred. Reliable electrical contact is achieved as a result. The plug contacts are designed to interact with connecting rails or connecting plates and essentially have a "U"-shaped profile, opposite thickened portions, which form the contact points, being provided on both leg ends.

A power semiconductor circuit arrangement having power semiconductor modules and connecting plates is additionally specified. The connecting plates are designed to interact with the plug contacts of the modules.

Further embodiments emerge from the corresponding dependent claims.

The invention has the particular advantage that reliable electrical contact is achieved simply by plugging the modules onto the connecting rails, and that the modules can also be separated again from the connecting rails in a very simple manner. In addition, the contact arrangement has a low inductance on account of the comparatively large contact area.

BRIEF DESCRIPTION OF THE DRAWINGS

The invention is explained in more detail below using exemplary embodiments in conjunction with the drawings, in which.

The reference symbols used in the drawings and their meaning are summarized in the list of reference symbols. In principle, identical parts are provided with identical reference symbols in the Figures.

DESCRIPTION OF THE PREFERRED EMBODIMENTS

Figure 1:
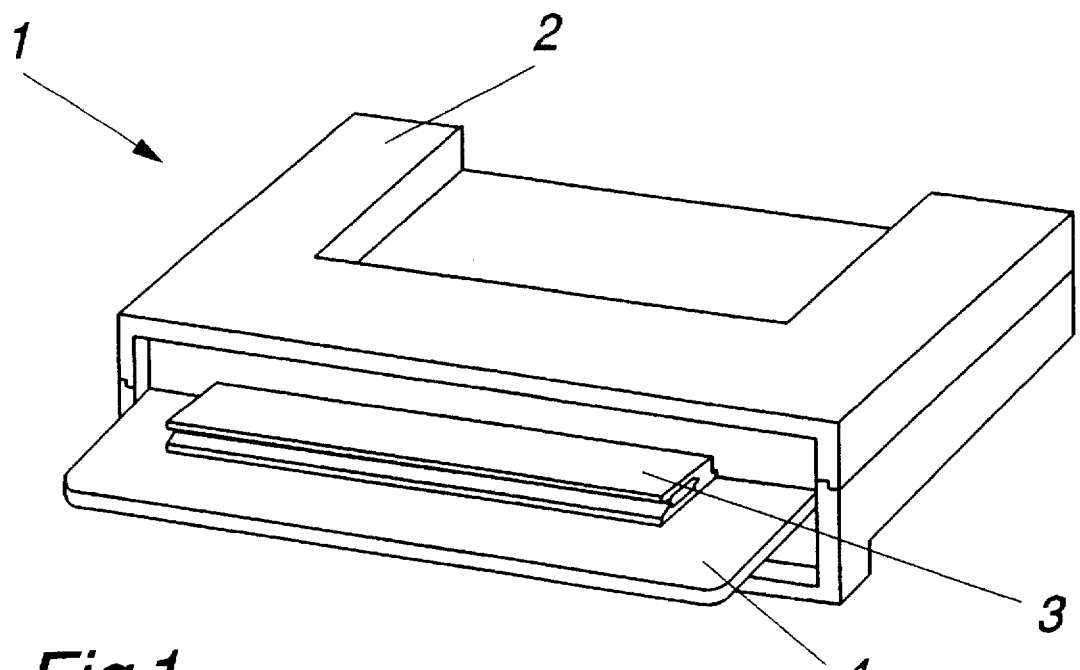
FIG. 1 shows a perspective view of a module according to the invention.

FIG. 1 shows a perspective view of a power semiconductor module 1 according to the invention. The latter comprises a housing 2 into which any desired power semiconductor circuit (not visible) is installed. The power semiconductor circuit has at least two connections, which are passed out of the housing 2. According to the invention, the connections have the form of an elongate plug contact 3. An insulating plate 4 may be additionally be provided between the adjacent plug contacts.

Figure 3:
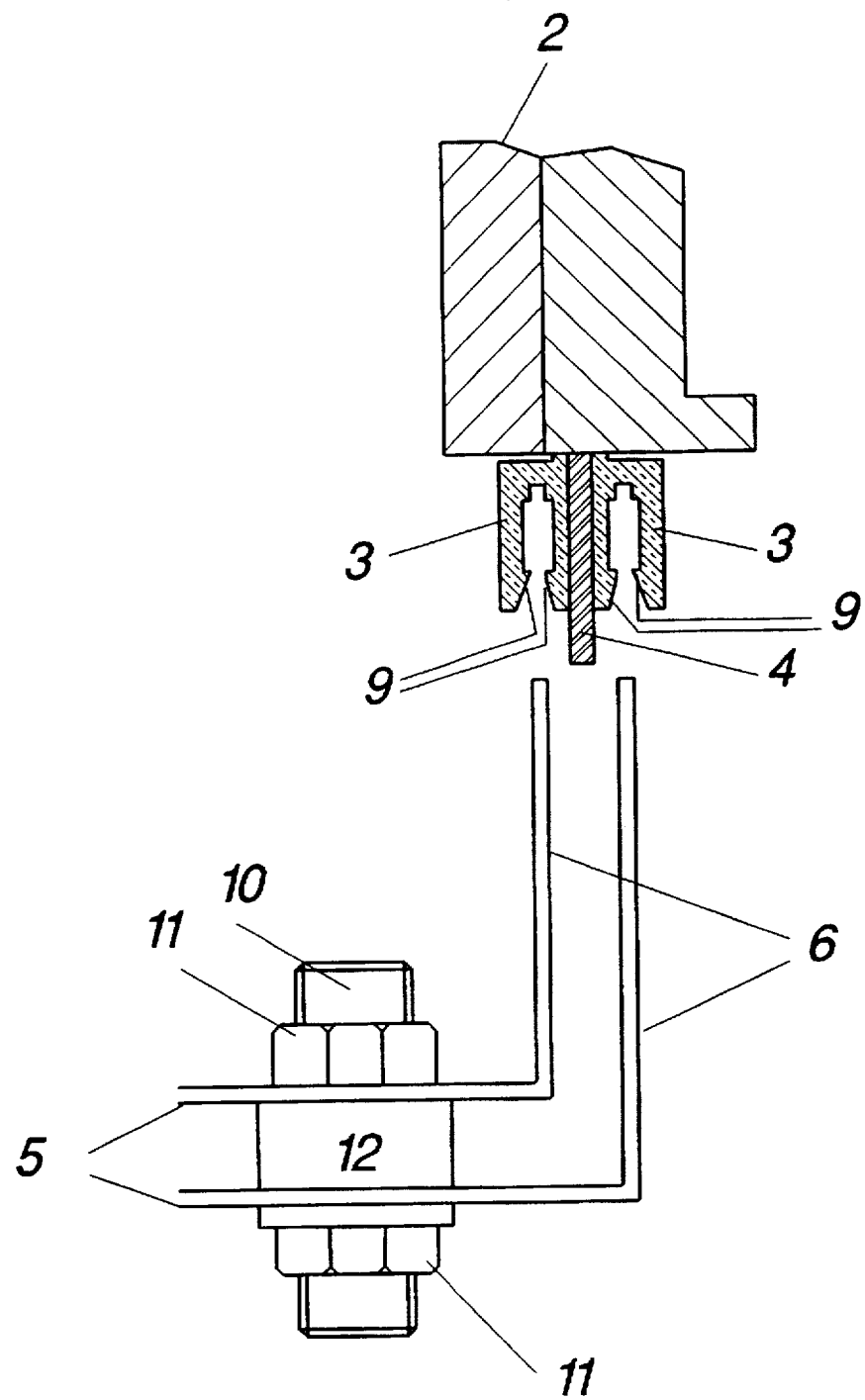
FIG. 3 shows a detailed view of the plug contacts in section, as well as an arrangement of connecting plates onto which a module according to the invention can be plugged.

FIG. 3 shows the plug contacts 3 in more detail. They have an essentially "U"-shaped profile. Thickened contact points 9 are arranged on the ends of the legs. If an electrically conductive plate, for example in the form of a lug 6 of a connecting plate 5, is now inserted into the plug contact 3, then the plug contact is forced open slightly on account of the slightly smaller separation of the contact points 9 compared with the plate thickness. The contact points consequently exert a pressure on the inserted plate on account of the elasticity of the plug contact material, thereby establishing good electrical contact.

A plug contact whose contact points comprise a multiplicity of parallel projections is particularly preferred. This ensures good electrical contact with the lugs 6 of the connecting plates 5.

Figure 4:
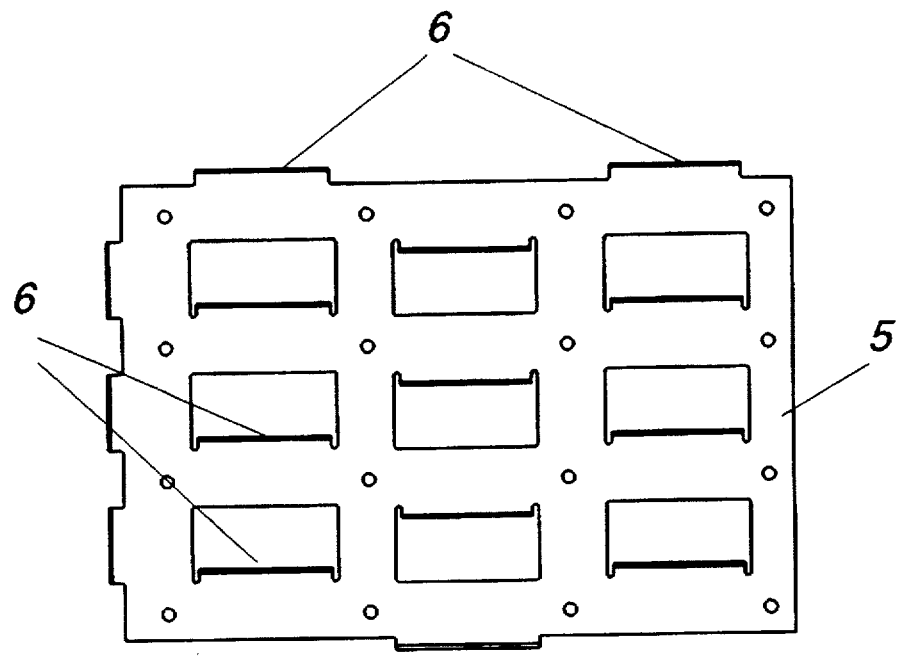
FIGS. 4, 5 show a plan view of two connecting plates which are suitable for the construction of a circuit arrangement with modules according to the invention.
Figure 5:
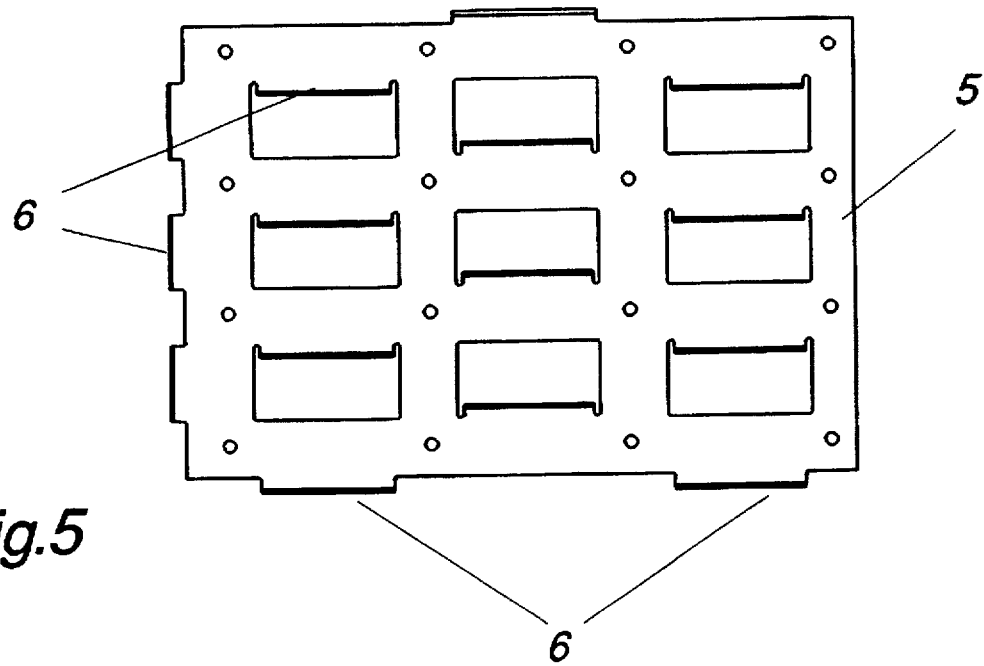

The connecting plates 5 form part of a power semiconductor circuit arrangement. As illustrated in FIG. 3, the connecting plates can be stacked one above the other and fastened together, or on a support (not illustrated), by means of screws 10, nuts 11 and inserted insulating sleeves 12. Lugs 6 are provided to enable the modules to be plugged by their plug contacts 3 onto the connecting plates 5. The connecting plates 5 preferably have a lattice structure, see FIGS. 4 and 5. The lugs 6, which are bent upward or welded on essentially at right angles to the connecting plates 5, are preferably provided at regular spacings in the cutouts and at the edges of the lattices. If two connecting plates 5 of this type are stacked one on top of the other, one of them being rotated through 180°, then an arrangement is produced which allows two modules always to be plugged on over the webs of the lattices. The comparatively large area of the connecting plates permits a low-inductance structure.

Figure 2:
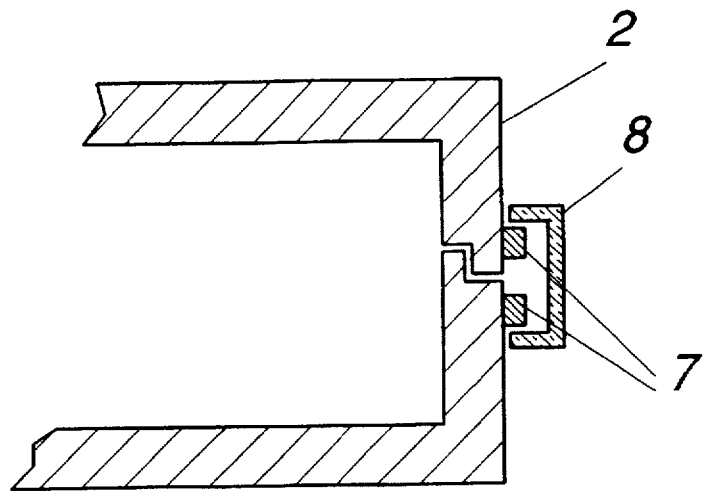
FIG. 2 shows part of a module housing in section.

FIG. 2 shows a detail of the structure of the module housing. The housing 2 comprises an upper half and a lower half, which are joined together like a rail. In order to fix the two halves, a respective guiding web 7 is provided for each half in the vicinity of the joint. The guiding webs 7 are held together by a U-shaped rail 8. A housing is thus obtained which can be joined together in a simple manner but nevertheless has a mechanically robust structure. Overall, then, the invention provides a power semiconductor module with which it is possible to achieve space-saving, but nevertheless mechanically robust and electrically reliable contact which has a low inductance on account of the elimination of cable loops.

| List of reference symbols |
| --- |
| 1 Power semiconductor module |
| 2 Module housing |
| 3 Plug contact |
| 4 Insulating plate |
| 5 Connecting plate |
| 6 Lug |
| 7 Guiding web |
| 8 U-shaped rail |
| 9 Contact point |
| 10 Screw |
| 11 Nut |
| 12 Insulating sleeve |

We claim:

1. A power semiconductor module comprising;
a module housing;
a power semiconductor circuit provided in the module housing;
at least two elongate plug contacts for providing at least two electrical connections, said at least two elongate plug contacts extending out of the module housing; and
wherein an insulating plate is provided between the at least two elongate plug contacts.

2. The power semiconductor module according to claim 1, wherein the at least two elongate plug contacts are arranged next to one another.

3. The power semiconductor module according to claim 2, wherein the at least two elongate plug contacts have a multiplicity of parallel contact points.

4. A power semiconductor circuit arrangement comprising:
a plurality of power semiconductor modules;
a plurality of connecting plates; and
wherein the power semiconductor modules comprise;
a module housing,
a power semiconductor circuit provided in the module housing,
at least two elongate plug contacts for providing at least two electrical connections, said at least two plug contacts extending out of the module housing, and
an insulating plate which is provided between the at least two elongate plug contacts; and
wherein the connecting plates are designed to mechanically and electrically connect with the plug contacts of the power semiconductor modules.

5. The power semiconductor circuit arrangement according to claim 4, wherein the connecting plates are arranged one above the other and have a lattice form provided with cut outs forming webs, and wherein the webs of the latticed connecting plates have, in the region of the cut outs and at the edge of the connecting plates, lugs which protrude essentially at right angles to mechanically and electrically connect with the elongate plug contacts.

6. The power semiconductor module according to claim 4, wherein the at least two elongate plug contacts are arranged next to one another.

7. The power semiconductor circuit arrangement according to claim 5, wherein the at least two elongate plug contacts have a multiplicity of parallel contact points.

* * * * *